(12) United States Patent
Chen et al.

(10) Patent No.: US 9,373,779 B1
(45) Date of Patent: Jun. 21, 2016

(54) MAGNETIC TUNNEL JUNCTIONS

(71) Applicant: Micron Technology, Inc., Boise, ID (US)

(72) Inventors: Wei Chen, White Plains, NY (US); Witold Kula, Gilroy, CA (US); Jonathan D. Harms, White Plains, NY (US); Sunil S. Murthy, New York, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/563,303

(22) Filed: Dec. 8, 2014

(51) Int. Cl.
| | |
|---|---|
| *H01L 43/08* | (2006.01) |
| *G11B 5/39* | (2006.01) |
| *H01L 43/10* | (2006.01) |
| *H01L 43/02* | (2006.01) |
| *H01L 27/115* | (2006.01) |
| *H01L 27/22* | (2006.01) |
| *B82Y 25/00* | (2011.01) |

(52) U.S. Cl.
CPC .............. *H01L 43/10* (2013.01); *B82Y 25/00* (2013.01); *G11B 5/39* (2013.01); *H01L 27/11502* (2013.01); *H01L 27/11507* (2013.01); *H01L 27/222* (2013.01); *H01L 43/02* (2013.01); *H01L 43/08* (2013.01)

(58) Field of Classification Search
USPC .......................................................... 257/4, 5
See application file for complete search history.

(56) References Cited

U.S. PATENT DOCUMENTS

| | | | |
|---|---|---|---|
| 5,640,343 A | 6/1997 | Gallagher et al. | |
| 5,898,548 A | 4/1999 | Dill | |
| 5,949,600 A | 9/1999 | Akiyama | |
| 5,994,899 A | 11/1999 | Mohri | |
| 6,048,632 A | 4/2000 | Solin | |
| 6,788,502 B1 | 9/2004 | Gill | |
| 7,595,520 B2 | 9/2009 | Horng et al. | |
| 7,629,637 B2 | 12/2009 | Kajiyama et al. | |
| 7,660,153 B2 * | 2/2010 | Yamane | G11C 11/16 365/158 |
| 7,944,738 B2 | 5/2011 | Liu et al. | |
| 8,102,700 B2 | 1/2012 | Liu et al. | |
| 8,218,357 B2 | 7/2012 | Liu et al. | |
| 8,310,861 B2 | 11/2012 | Liu et al. | |

(Continued)

FOREIGN PATENT DOCUMENTS

| | | |
|---|---|---|
| JP | 2008-034857 | 2/2008 |
| JP | 2013-140891 | 7/2013 |

(Continued)

OTHER PUBLICATIONS

U.S. Appl. No. 14/684,110, filed Apr. 10, 2015, Sandhu.

(Continued)

*Primary Examiner* — Minh-Loan Tran
(74) *Attorney, Agent, or Firm* — Wells St. John, P.S.

(57) ABSTRACT

A magnetic tunnel junction includes a conductive first magnetic electrode that includes magnetic recording material. A conductive second magnetic electrode is spaced from the first electrode and includes magnetic reference material. A non-magnetic tunnel insulator material is between the first and second electrodes. The magnetic reference material of the second electrode includes a non-magnetic region comprising elemental iridium. The magnetic reference material includes a magnetic region comprising elemental cobalt or a cobalt-rich alloy between the non-magnetic region and the tunnel insulator material.

33 Claims, 2 Drawing Sheets

(56) References Cited

U.S. PATENT DOCUMENTS

| | | | |
|---|---|---|---|
| 8,559,141 | B1 | 10/2013 | Pakala et al. |
| 8,842,465 | B2* | 9/2014 | Yamane .................. H01L 43/10 365/148 |
| 9,099,124 | B1 | 8/2015 | Freitag |
| 9,177,573 | B1 | 11/2015 | Oh |
| 2004/0057295 | A1 | 3/2004 | Matsukawa et al. |
| 2005/0006682 | A1 | 1/2005 | Bae et al. |
| 2005/0247964 | A1 | 11/2005 | Pietambaram et al. |
| 2005/0254289 | A1 | 11/2005 | Nakajima et al. |
| 2007/0243638 | A1 | 10/2007 | Horng et al. |
| 2008/0144234 | A1 | 6/2008 | Lin |
| 2011/0149646 | A1 | 6/2011 | Liu et al. |
| 2011/0318848 | A1 | 12/2011 | Choi |
| 2012/0056285 | A1 | 3/2012 | Bessho et al. |
| 2012/0068139 | A1 | 3/2012 | Daibou |
| 2012/0087179 | A1 | 4/2012 | Jung |
| 2012/0127603 | A1 | 5/2012 | Gao |
| 2012/0193216 | A1 | 8/2012 | Endo |
| 2013/0071954 | A1 | 3/2013 | Zhou |
| 2013/0148418 | A1 | 6/2013 | Luo et al. |
| 2013/0181305 | A1 | 7/2013 | Nakayama et al. |
| 2013/0224521 | A1* | 8/2013 | Wang ...................... G11B 5/66 428/828 |
| 2013/0236639 | A1 | 9/2013 | Carey |
| 2013/0241015 | A1 | 9/2013 | Nomachi |
| 2014/0027869 | A1* | 1/2014 | Lee ......................... H01L 43/02 257/421 |
| 2014/0084401 | A1 | 3/2014 | Kato |
| 2014/0269033 | A1 | 9/2014 | Natori et al. |
| 2014/0284742 | A1 | 9/2014 | Sawada et al. |
| 2015/0069562 | A1 | 3/2015 | Sandhu |
| 2015/0137289 | A1 | 5/2015 | Khalili-Amiri |
| 2015/0280113 | A1 | 10/2015 | Tan |

FOREIGN PATENT DOCUMENTS

| | | |
|---|---|---|
| KR | 10-2008-0084590 | 9/2008 |
| WO | PCT/US2014/047572 | 10/2014 |
| WO | WO PCT/US2015/061568 | 2/2016 |

OTHER PUBLICATIONS

U.S. Appl. No. 14/687,280, filed Apr. 15, 2015, Siddik et al.
U.S. Appl. No. 14/687,317, filed Apr. 15, 2015, Siddik.
U.S. Appl. No.: 14/704,023, filed May 5, 2015, Siddik.
U.S. Appl. No. 14/706,182, filed May 7, 2015, Harms.
Annealing influence on the Gilbert damping parameter and the exchange constant of CoFeB thin films; Conca et al.; Applied Physics Letter 104; May 8, 2014; pp. 182407-1-182401-4.
Comparative material issues for fast reliable switching in STT-RAMS; Munira et al.; 2011 11th IEEE International Conference on Nanotechnology; Aug. 15-18, 2012; pp. 1403-1408.
Damping of CoxFe80-xB20 ultrathin films with perendicular magnetic anisotropy; Devolder et al.; Applied Physics Letters 102; Jan. 15, 2013; pp. 022407-1-022407-4.
Microstructure and magnetic properties of FeCoN thin films; Kuo et al.; Journal of Applied Physics, vol. 83, No. 11; Jun. 1, 1998; pp. 6643-6645.
Spin Pumping and Spin Transfer; Brataas et al.; arXiv:1108.0385v3[cond-ma.tmes-hall]; Mar. 6, 2012; pp. 1-30.
Sputtered FeCoN Soft Magnetic Thin Films With High Resistivity; Jiang et al.; IEEE Transactions on Magnetics, vol. 39, No. 6; Nov. 2003; pp. 3559-3562.
Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.
Atomic and Electronic Structure of CoFeB/MgO Interface from First Principles; Burton et al.; Applied Physics Letters, vol. 89; Oct. 5, 2006; pp. 142507-1 to 142507-3.
Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.
Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.
Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.
Boron segregation in crystallized MgO/amorphous—Co 40 Fe 40 B 20 Co 40 Fe 40 B20 Co 40 Fe 40 B 20 thin films; You et al.; Journal of Applied Physics, vol. 104, Aug. 5, 2008; pp. 033517-1 to 033517-6.
Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.
Exchange coupling of bilayers and synthetic antiferromagnets pinned to MnPt; Rickart et al.; The European Physical Journal B; Mar. 8, 2005; pp. 1-6.
Giant tunnelling magnetoresistance at room temperature with MgO (100) tunnel barriers; Parkin et al.; nature materials, vol. 3; Oct. 31, 2004; pp. 862-867.
Magnetic Tunnel Junctions; Zhu et al.; Materialstoday; vol. 9, No. 11; Nov. 2006; pp. 36-45.
Magnetoresistive Random-Access Memory; www.wikipedia.org/wiki/RAM; As downloaded from the Internet Jul. 28, 2013; 10 pp.
MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advanced Research Laboratory, Hitachi, Ltd.; Dec. 11, 2009; 17 pp.
On the role of Ta cap in the recrystallization process of CoFeB layers; Bouchikhaoui et al.; Applied Physics Letters, vol. 103; Oct. 3, 2013; pp. 142412-1 to 142412-5.
Spin-dependent tunneling conductance of FezMgOzFe sandwiches; Butler et al.; The American Physical Society; Physical Review B, vol. 63; Jan. 8, 2001; pp. 054416-1 to 054416-12.
Spin-Transfer Torque; www.wikipedia.org/wiki/Spin-transfer_torque; As downloaded from the Internet Aug. 2, 2013; 2 pp.
Status and Challenges for Non-Volatile Spin-Transfer Torque RAM (STT-RAM); Krounbi et al.; International Symposium on Advanced Gate Stack-Technology; Sep. 23, 2010; 28 pp.
Theory of tunneling magnetoresistance of an epitaxial FeÕMgOÕFe?001? junction; Butler et al.; The American Physical Society; Physical Review B, vol. 63; May 10, 2001; pp. 220403-1 to 220403-4.
Tunnel Magnetoresistance; www.wikipedia.org/wiki/tunnel_manetoresistance; As downloaded from the Internet Jul. 28, 2013; 5 pp.
Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.
Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.

* cited by examiner

US 9,373,779 B1

MAGNETIC TUNNEL JUNCTIONS

TECHNICAL FIELD

Embodiments disclosed herein pertain to magnetic tunnel junctions.

BACKGROUND

A magnetic tunnel junction is an integrated circuit component having two conductive magnetic electrodes separated by a thin non-magnetic insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. The resistance of current flow between those two nodes through the reference electrode, insulator material, and the recording electrode is dependent upon the overall magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having 50% "spin-up" and 50% "spin-down" electrons). A spin-polarized current is one with more electrons of either spin. By passing a current through magnetic material, one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

DETAILED DESCRIPTION OF EXAMPLE EMBODIMENTS

Figure 3:
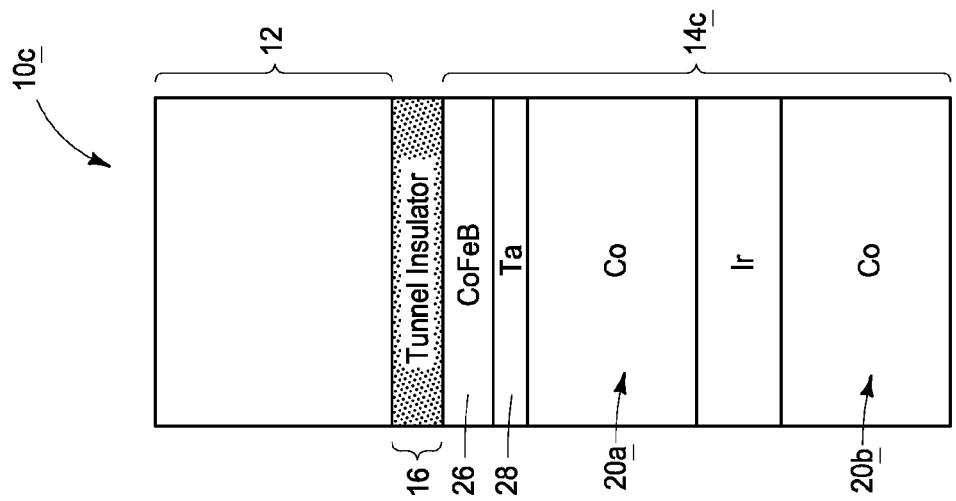
FIG. 3 is a diagrammatic structural view of a magnetic tunnel junction in accordance with an embodiment of the invention.

A magnetic tunnel junction in accordance with an embodiment of the invention is initially described with reference to FIG. 1. Such comprises a construction 10 which may comprise the primary materials of the magnetic tunnel junction. Materials may be aside, elevationally inward, or elevationally outward of construction 10. For example, other partially or wholly fabricated components of integrated circuitry may be provided somewhere about construction 10, and are not particularly germane to the inventions disclosed herein.

Construction 10 comprises a conductive (i.e., electrically) first magnetic (i.e., ferrimagnetic or ferromagnetic) electrode 12 comprising magnetic recording material. A conductive second magnetic electrode 14 is spaced from first electrode 12 and comprises magnetic reference material. Accordingly, first electrode 12 may function as a recording electrode and second electrode 14 may function as a reference electrode. A non-magnetic tunnel insulator material 16 is between first electrode 12 and second electrode 14. Unless otherwise indicated, any of the materials and/or structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples. The magnetic recording material and the magnetic reference material are individually overall and collectively magnetic even though one or both may have one or more regions therein which are intrinsically non-magnetic.

The positions of first electrode 12 and second electrode 14 may be reversed. Further, construction 10 in FIG. 1 is shown as being generally vertically or elevationally oriented. However, other orientations may be used, for example horizontal; diagonal, one or more combinations of horizontal, vertical, diagonal; etc. In this document, "horizontal" refers to a general direction along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", and "bottom" are with reference to the vertical direction. Regardless, example thicknesses for first electrode 12, tunnel insulator material 16, and second electrode 14 are about 5 to 200 Angstroms, about 5 to 50 Angstroms, and about 20 to 300 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness unless otherwise indicated.

Any existing or yet-to-be developed compositions may be used for tunnel insulator material 16 and first electrode 12. As examples, tunnel insulator material 16 may comprise, consist essentially of, or consist of one or more of MgO, $TiO_x$, and AlO$_x$. As examples, magnetic recording material of first electrode 12 may comprise, consist essentially of, or consist of a mixture of cobalt, iron, boron, and additional metals/materials (e.g., one or more of Ni, Mg, CrO$_2$, NiMnSb, PtMnSb, RXMnO$_3$ [R: rare earth; X: Ca, Ba, and/or Sr]).

The magnetic reference material of second electrode 14 includes a non-magnetic region 18 and a magnetic region 20. Non-magnetic region 18 comprises, consists essentially of, or consists of elemental iridium. Magnetic region 20 comprises, consists essentially of, or consists of elemental cobalt or a cobalt-rich alloy, and is between non-magnetic region 18 and tunnel insulator material 16. In the context of this document, a "cobalt-rich alloy" is an alloy in which cobalt is the greatest quantity element of all elements considered in total on an atomic/molar basis. Example cobalt-rich alloys include CoFeB and CoM (where M can be one or more of Ta, Ti, W, Mg, or Ru). Magnetic region 20 may comprise, consist essentially of, or consist of both elemental cobalt and one or more cobalt-rich alloys, with FIG. 1 only showing elemental cobalt.

In one embodiment, the elemental iridium is directly against the elemental cobalt or cobalt-rich alloy, and in one embodiment the elemental cobalt or cobalt-rich alloy is directly against the tunnel insulator material. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. If two stated materials are not directly against one another, a material of different composition is there-between. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In one embodiment, the elemental iridium may not be directly against the elemental cobalt or cobalt-rich alloy, or the elemental cobalt or cobalt-rich alloy may not be directly against the tunnel insulator material. For example, the second electrode may comprise an alloy comprising cobalt, iron, and boron (not shown in FIG. 1) between the elemental cobalt or cobalt-rich alloy and the tunnel insulator material. Further in such example, an elemental tantalum layer may be provided between the elemental cobalt or cobalt-rich alloy and the alloy that comprises cobalt, iron, and boron.

Figure 1:
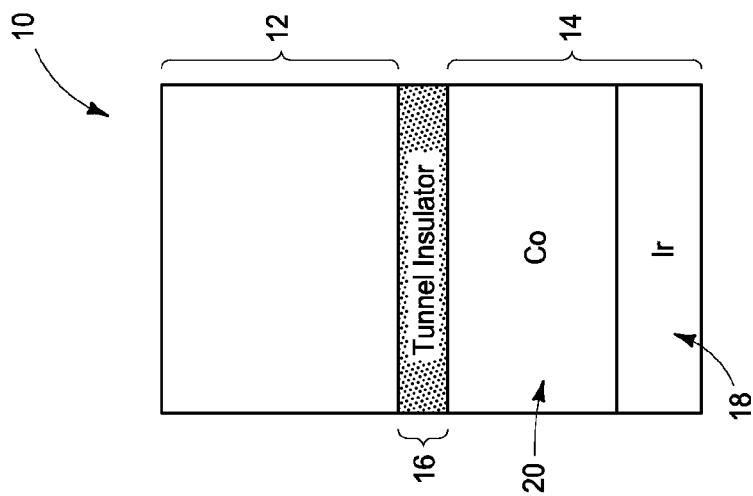
FIG. 1 is a diagrammatic structural view of a magnetic tunnel junction in accordance with an embodiment of the invention.

The elemental iridium and the elemental cobalt or cobalt-rich alloy may have the same or different respective maximum thicknesses, with different maximum thicknesses being shown in FIG. 1. In one embodiment, the elemental cobalt or cobalt-rich alloy has greater maximum thickness than the elemental iridium. An example maximum thickness for elemental cobalt or cobalt-rich alloy 20 is from about 2 to 30 Angstroms, with an ideal narrower example being from about 4 to 20 Angstroms. An example maximum thickness for elemental iridium 18 is from about 2 to 15 Angstroms, with from about 4 to 7 Angstroms being an ideal narrower example. A specific example regarding thickness is first electrode 12 about 14 Angstroms, tunnel insulator 16 about 12 Angstroms, and second electrode 14 about 15 Angstroms, with magnetic region 20 about 10 Angstroms and non-magnetic region 18 about 5 Angstroms.

In some embodiments (for example as described below), the magnetic reference material of the second electrode comprises multiple spaced magnetic regions individually comprising elemental cobalt or cobalt-rich alloy between the non-magnetic region and the non-magnetic tunnel insulator material. In some such embodiments, at least some immediately adjacent of the multiple spaced magnetic regions are separated from one another by elemental iridium. Regardless, in one embodiment the second electrode is devoid of nickel and in one embodiment is devoid of ruthenium.

Figure 2:
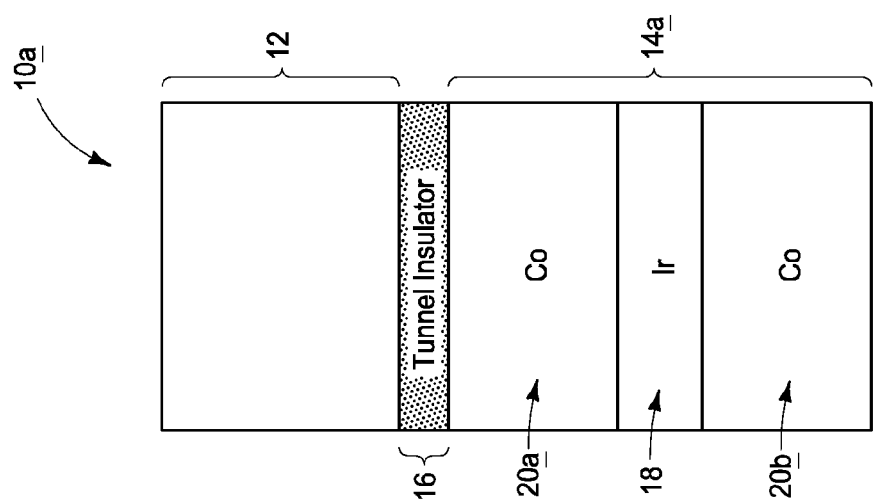
FIG. 2 is a diagrammatic structural view of a magnetic tunnel junction in accordance with an embodiment of the invention.

An alternate example embodiment magnetic tunnel junction construction 10a is shown in FIG. 2. Like numerals from the above-described embodiments have been used where appropriate, with some construction differences being indicated with the suffixes "a" or "b". Construction 10a comprises conductive first magnetic electrode 12, conductive second magnetic electrode 14a, and tunnel insulator material 16 there-between. Second electrode 14a comprises two spaced regions 20a, 20b individually comprising cobalt or a cobalt-rich alloy. One of such regions (e.g., 20a) is closer to tunnel insulator material 16 than the other (e.g., 20b). Elemental iridium 18 is between the two regions 20a and 20b. More than two (not shown in FIG. 2) spaced regions 20a, 20b may be provided, for example as described in some embodiments below. Regardless, such spaced regions may have the same or different respective maximum thicknesses. Regardless, in one embodiment the elemental iridium may have smaller maximum thickness than at least one of two regions 20a, 20b, and in one embodiment may have smaller maximum thickness than each of such two regions. Regardless, in one embodiment second electrode 14a between all spaced regions that comprise elemental cobalt or cobalt-rich alloy (e.g., 20a, 20b) is devoid of nickel and devoid of ruthenium. Any other attribute(s) or construction(s) as described above may be used.

Another magnetic tunnel junction construction 10c in accordance with an embodiment of the invention is shown in FIG. 3. Like numerals from the above-described embodiments have been used where appropriate, with some construction differences being indicated with the suffix "c" or different numerals. In construction 10c, second electrode 14c comprises an alloy 26 comprising cobalt, iron, and boron between tunnel insulator material 16 and region 20a. An example thickness for alloy 26 is about 2 to 25 Angstroms, with a specific example composition being $Co_{0.6}Fe_{0.2}B_{0.2}$. In one embodiment, alloy 26 is directly against tunnel insulator material 16. In one embodiment, alloy 26 is not directly against region 20a, for example with construction 10c being shown as comprising elemental tantalum 28 between alloy 26 and region 20a. An example thickness for tantalum 28 is about 2 to 15 Angstroms. Alloy 26 may be provided, by way of example, when tunnel insulator material 16 and alloy 26 are of a crystalline body-centered-cubic (BCC) lattice and elemental cobalt or cobalt-rich alloy 20a is of a crystalline face-centered-cubic (FCC) lattice, and elemental tantalum 28 may be provided as a buffer between what would otherwise be a BCC lattice directly against an FCC lattice. Regardless, any other attribute(s) or construction(s) as described above may be used.

Figure 4:
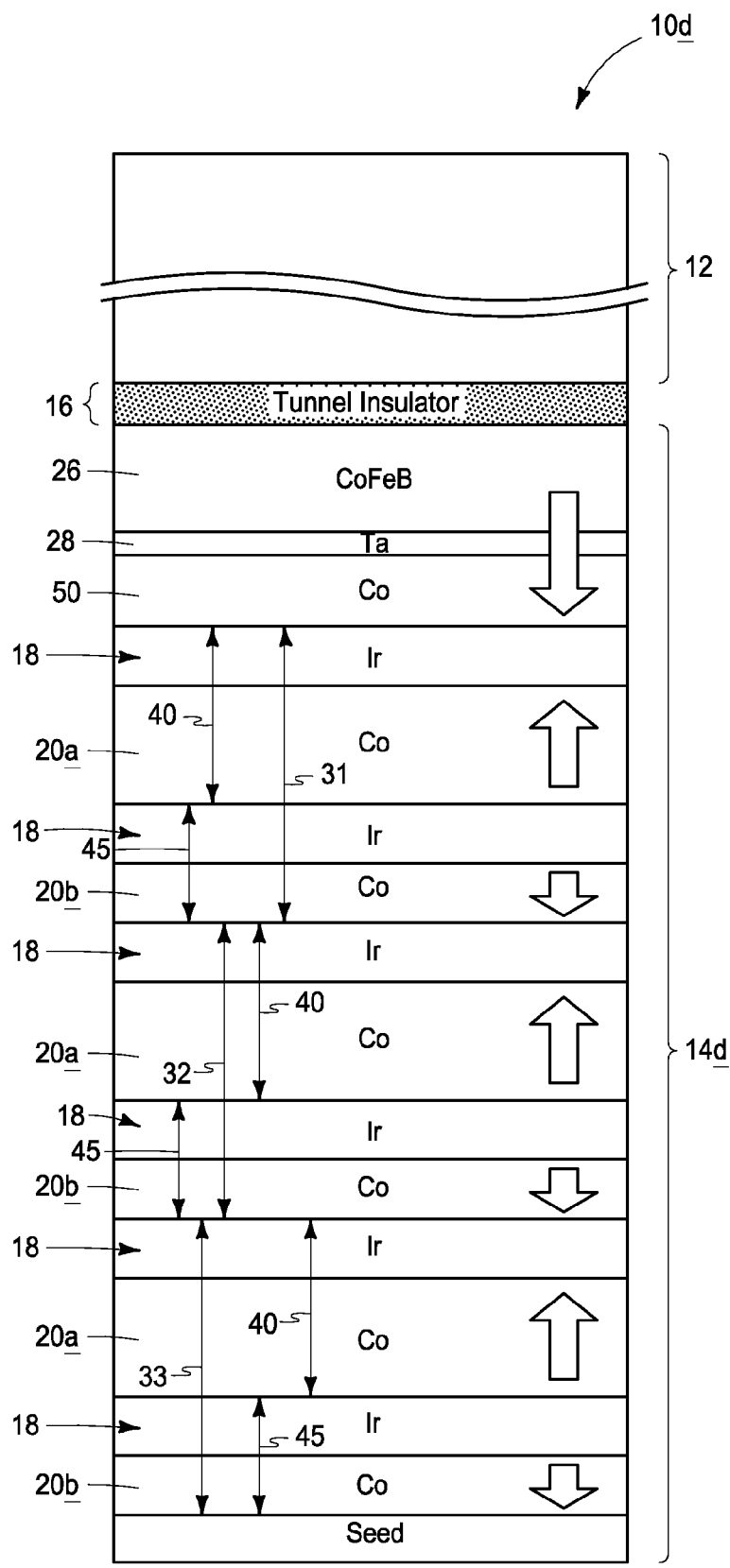
FIG. 4 is a diagrammatic structural view of a magnetic tunnel junction in accordance with an embodiment of the invention.

Another example magnetic tunnel junction construction 10d is shown in FIG. 4. Like numerals from the above-described embodiments have been used where appropriate, with some construction differences being indicated with the suffix "d" or with different numerals. Construction 10d comprises conductive first magnetic electrode 12, conductive second magnetic electrode 14d, and tunnel insulator material 16 there-between. Second electrode 14d comprises two composites 31, 32 individually comprising two pairs 40, 45 of alternating regions. More than two composites may be used, with magnetic tunnel junction construction 10d shown as comprising three composites 31, 32, and 33. The composites need not be the same in composition or construction relative each other. However, one of the alternating regions (e.g., 20a, 20b) in each pair (e.g., 40, 45, respectively) comprises elemental cobalt or a cobalt-rich alloy. Further, the other of the alternating regions (e.g., 18) in each pair comprises elemental iridium.

The regions of elemental iridium in individual of pairs 40, 45 may have the same or different respective maximum thicknesses, with the same maximum thickness being shown for regions 18. Likewise, the regions of cobalt or cobalt-rich alloy in individual of pairs 40, 45 may have the same or different respective maximum thicknesses, with different respective maximum thicknesses being shown in regions 20a, 20b. Regardless, alternating regions 20b/18/20a/18 individually may be of constant thickness or of variable thickness, with constant respective thicknesses being shown for each. In one embodiment, alternating regions 20b/18 and 20a/18 in each pair are directly against one another (e.g., region 20b is directly against its immediately adjacent region 18 and region 20a is directly against its immediately adjacent region 18). In one embodiment, the two composites are directly against one another. For example and as shown, the two composites 31 and 32 are directly against one another and the two composites 32 and 33 are directly against one another. In one embodiment, the one of two composites that is closer to the non-magnetic tunnel insulator material than the other of two given composites is not directly against the non-magnetic tunnel insulator material. For example, composite 31 is not directly against tunnel insulator material 16. Rather, example second electrode 14d is shown as comprising material 50 (e.g., elemental cobalt or cobalt-rich alloy) between composite 31 and tunnel insulator material 16. Accordingly, material 50 is also between composite 32 and tunnel insulator material 16, and is also between composite 33 and tunnel insulator material 16. Additionally in the example FIG. 4 embodiment, alloy 26 comprising cobalt, iron, and boron and elemental tantalum 28 comprise part of second electrode 14d. In one embodiment, second electrode 14d between all spaced regions that comprise elemental cobalt or cobalt-rich alloy (e.g., between all regions 20a and 20b) is devoid of nickel and devoid of ruthenium.

In one embodiment and as shown, closer pairs 40 of the alternating regions in individual composites 31, 32, and 33 have a maximum thickness that is greater than maximum thickness of other pair 45.

A specific example regarding thicknesses is regions 18 and 20b each about 5 Angstroms, regions 20a about 10 Angstroms, material 50 about 6 Angstroms, material 28 about 2 Angstroms, material 26 about 9 Angstroms, material 16 about 12 Angstroms, and first electrode 12 about 14 Angstroms.

Example large hollow vertical arrows are shown with respect to certain regions within second electrode 14d intending to be indicative of possible magnetic orientations. Further, the lengths of such arrows are intended to be indicative of greater magnetic magnitude in such respective directions. Such are, however, by way of examples only. Specifically, by way of examples only, the magnetic direction of such regions in second electrode 14d could be reversed from what is shown, or further by way of example be in the same direction and/or of differing magnitudes. Any other attribute(s) or construction(s) as described above may be used.

Using a second electrode having magnetic reference material comprising non-magnetic elemental iridium and magnetic elemental cobalt or a cobalt-rich alloy between the elemental iridium and the tunnel insulator material may enable, although not require, certain advantages to be achieved. For example, such may enable simplification of the materials set of the magnetic reference material for the reference electrode. Additionally or alternatively, such may allow for a more varied stack design of the magnetic reference material in achieving a more stable magnetic reference material with moment balance for higher STT efficiency in such devices. Alternately or additionally, stray magnetic field impact on the magnetic recording material of the recording electrode may be minimized, perhaps including a reduced in-plane field component due to locally compensated magnetic moment for STT efficiency gain in allowing reduction of required programming current. Additionally or alternatively, elemental iridium may provide improved diffusion barrier efficiency within the stack compared to other magnetic reference materials which may enable or result in higher tunneling magnetoresistance (TMR) and better thermal endurance, for example in excess of 400° C. Alternately or additionally, a simplified magnetic reference material composite with reduced stack height may be provided for tighter cell-to-cell distribution for STT parameters. Such a low-height magnetic tunnel junction stack may enable high-density product design with reduced processing efforts particularly in steps like etching and encapsulation where such are used.

CONCLUSION

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The magnetic reference material of the second electrode includes a non-magnetic region comprising elemental iridium. The magnetic reference material includes a magnetic region comprising elemental cobalt or a cobalt-rich alloy between the non-magnetic region and the tunnel insulator material.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The second electrode comprises two spaced regions individually comprising elemental cobalt or a cobalt-rich alloy. One of the two regions is closer to the tunnel insulator material than is the other of the two regions. Elemental iridium is between the two regions.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material is between the first and second electrodes. The second electrode comprises two composites individually comprising two pairs of alternating regions. One of the alternating regions in each pair comprises elemental cobalt or a cobalt-rich alloy. The other of the alternating regions in each pair comprises elemental iridium.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A magnetic tunnel junction, comprising:
   a conductive first magnetic electrode comprising magnetic recording material;
   a conductive second magnetic electrode spaced from the first electrode and comprising magnetic reference material;
   a non-magnetic tunnel insulator material between the first and second electrodes; and
   the magnetic reference material of the second electrode including a non-magnetic region comprising elemental iridium, the magnetic reference material including a magnetic region comprising elemental cobalt or a cobalt-rich alloy between the non-magnetic region and the tunnel insulator material, elemental Ta being between the elemental cobalt or cobalt-rich alloy and the tunnel insulator material, an alloy comprising Co, Fe, and B being between the elemental Ta and the tunnel insulator material.

2. The magnetic tunnel junction of claim 1 wherein the magnetic region comprises elemental cobalt.

3. The magnetic tunnel junction of claim 1 wherein the magnetic region comprises a cobalt-rich alloy.

4. The magnetic tunnel junction of claim 1 wherein the magnetic region comprises elemental cobalt and a cobalt-rich alloy.

5. The magnetic tunnel junction of claim 1 wherein the elemental iridium is directly against the elemental cobalt or cobalt-rich alloy.

6. The magnetic tunnel junction of claim 1 wherein the elemental iridium and the elemental cobalt or cobalt-rich alloy have different respective maximum thicknesses.

7. The magnetic tunnel junction of claim 6 wherein the elemental cobalt or cobalt-rich alloy has greater maximum thickness than the elemental iridium.

8. The magnetic tunnel junction of claim 1 wherein the elemental iridium and the elemental cobalt or cobalt-rich alloy have the same maximum thickness.

9. The magnetic tunnel junction of claim 1 wherein the magnetic reference material comprises multiple spaced magnetic regions individually comprising elemental cobalt or cobalt-rich alloy between the non-magnetic region and the tunnel insulator material.

10. The magnetic tunnel junction of claim 9 wherein at least some of immediately adjacent of the multiple spaced magnetic regions are separated from one another by elemental iridium.

11. The magnetic tunnel junction of claim 1 wherein the magnetic region is of uniform thickness.

12. The magnetic tunnel junction of claim 1 wherein the non-magnetic region is of uniform thickness.

13. The magnetic tunnel junction of claim 1 wherein the second electrode is devoid of nickel.

14. The magnetic tunnel junction of claim 1 wherein the elemental Ta is directly against the elemental cobalt or a cobalt-rich alloy and directly against the alloy comprising Co, Fe, and B.

15. The magnetic tunnel junction of claim 14 wherein the alloy comprising Co, Fe, and B is directly against the tunnel insulator.

16. A magnetic tunnel junction, comprising:
    a conductive first magnetic electrode comprising magnetic recording material;
    a conductive second magnetic electrode spaced from the first electrode and comprising magnetic reference material;
    a non-magnetic tunnel insulator material between the first and second electrodes; and
    the second electrode comprising two spaced regions individually comprising elemental cobalt or a cobalt-rich alloy, one of the two regions being closer to the tunnel insulator material than the other of the two regions, elemental iridium between the two regions, elemental Ta being between the one region and the tunnel insulator material, an alloy comprising Co, Fe, and B being between the elemental Ta and the tunnel insulator material.

17. The magnetic tunnel junction of claim 16 wherein the alloy comprising cobalt, iron, and boron is directly against the tunnel insulator material and directly against the elemental Ta.

18. The magnetic tunnel junction of claim 16 wherein the two regions have different respective maximum thicknesses.

19. The magnetic tunnel junction of claim 16 wherein the two regions have the same maximum thickness.

20. The magnetic tunnel junction of claim 16 wherein the elemental iridium has smaller maximum thickness than at least one of the two regions.

21. The magnetic tunnel junction of claim 16 wherein the elemental iridium has smaller maximum thickness than each of the two regions.

22. The magnetic tunnel junction of claim 16 wherein the second electrode between all spaced regions that comprise elemental cobalt or cobalt-rich alloy is devoid of nickel and devoid of ruthenium.

23. A magnetic tunnel junction, comprising:
    a conductive first magnetic electrode comprising magnetic recording material;
    a conductive second magnetic electrode spaced from the first electrode and comprising magnetic reference material;
    a non-magnetic tunnel insulator material between the first and second electrodes; and
    the second electrode comprising two composites individually comprising two pairs of alternating regions, one of the alternating regions in each pair comprising elemental cobalt or a cobalt-rich alloy, the other of the alternating regions in each pair comprising elemental iridium, one of the two pairs in the individual composites being closer to the tunnel insulator material than is the other of the two pairs, elemental Ta being between the one pair and the tunnel insulator material, an alloy comprising Co, Fe, and B being between the elemental Ta and the tunnel insulator material.

24. The magnetic tunnel junction of claim 23 wherein the one pair has a maximum thickness that is greater than maximum thickness of the other pair.

25. The magnetic tunnel junction of claim 23 comprising three of said composites.

26. The magnetic tunnel junction of claim 23 wherein the second electrode comprises elemental cobalt or a cobalt-rich alloy between the one composite and the tunnel insulator material.

27. The magnetic tunnel junction of claim 23 wherein the regions of elemental iridium in individual of the two pairs have the same maximum thickness.

28. The magnetic tunnel junction of claim 23 wherein the regions of cobalt or cobalt-rich alloy in individual of the two pairs have different respective maximum thicknesses.

29. The magnetic tunnel junction of claim 28 wherein the regions of elemental iridium in individual of the two pairs have the same maximum thickness.

30. The magnetic tunnel junction of claim 23 wherein the alternating regions individually are of constant thickness.

31. The magnetic tunnel junction of claim 23 wherein the alternating regions in each pair are directly against one another.

32. The magnetic tunnel junction of claim 23 wherein the two composites are directly against one another.

33. The magnetic tunnel junction of claim 23 wherein the second electrode between all spaced regions that comprise elemental cobalt or cobalt-rich alloy is devoid of nickel and devoid of ruthenium.

* * * * *